(12) United States Patent
Lee

(10) Patent No.: US 6,171,960 B1
(45) Date of Patent: Jan. 9, 2001

(54) METHOD OF FABRICATING COPPER INTERCONNECTION

(75) Inventor: Ellis Lee, Taipei (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/057,812

(22) Filed: Apr. 9, 1998

(30) Foreign Application Priority Data

Feb. 6, 1998 (TW) ................................................ 87101560

(51) Int. Cl.$^7$ ............................................... H01L 21/44
(52) U.S. Cl. .................... 438/687; 438/629; 438/630; 438/658
(58) Field of Search .................................. 438/687, 664, 438/658, 628, 629, 630

(56) References Cited

U.S. PATENT DOCUMENTS 5,447,887 * 9/1995 Filipiak ............................... 438/687

* cited by examiner

Primary Examiner—Caridad Everhart
(74) Attorney, Agent, or Firm—Thomas, Kayden, Horstemeyer & Risley

(57) ABSTRACT

A method of fabricating copper interconnection is provided comprising forming a dielectric layer with a trench or a via on a semiconductor substrate. A titanium layer is formed on the dielectric layer. A copper layer doped with light silicon is formed in the trench or the via. The copper layer is encapsulated by annealing to make silicon doped in the copper layer diffuse toward the surface of the copper to react with the titanium layer and the gas. It prevents the copper layer from oxidation and diffusion to increase the yield.

15 Claims, 4 Drawing Sheets

METHOD OF FABRICATING COPPER INTERCONNECTION

BACKGROUND OF THE INVENTION

1. Field of the Invention

The invention relates in general to ultra scale integrated circuits, and more particularly to a method of fabricating copper interconnects in ultra scale integrated circuits.

2. Description of the Related Art

The fabrication of deep submicron ultra large scale integrated (ULSI) circuits requires long interconnects having small contacts and small cross-sections. To achieve the above objectives, the preferred interconnect material is copper. Copper provides a number of advantages for wiring applications including low resistivity and a high melting point.

At present, aluminum is the material used in fabricating interconnects on most integrated circuits. This invention seeks to replace the aluminum with copper in the fabrication of advanced circuits and ultra-fast logic devices.

Many problems, however, are encountered in fabricating circuit interconnects with copper. Some of the major difficulties include: (a) copper oxidizes easily at low temperatures; (2) copper has poor adhesion to substrates; (3) copper diffuses into silicon dioxide and other dielectric material used in micro-circuitry; and (4) copper requires a high temperature for patterning by reactive ion etching.

In order to overcome these disadvantages when using copper as an interconnect material, it is necessary to passify the copper surfaces and provide diffusion barriers between the copper and the adjacent layers. A layer of titanium nitride (TiN) has been suggested as a possible diffusion barrier due to its inert and conductive nature.

FIGS. 1A–1D are cross-sectional views showing a conventional method of fabricating copper interconnects. Referring to FIG. 1A, a semiconductor substrate 100 is provided. A dielectric layer 104 with a via 102 is formed on the semiconductor substrate 100. A titanium layer 106 is formed, for example, by sputtering in the via 102 and on the dielectric layer 104 under argon gas. The titanium layer 106 has a thickness of about 200–500 Å.

Referring to FIG. 1B, a first titanium nitride layer 108 is formed, for example, by nitriding under $N_2$ gas or $NH_3$ gas at high temperature on the titanium layer 106 as a adhesion layer.

Referring to FIG. 1C, a copper layer 110 is formed on the first titanium nitride layer 108. Excess copper material outside of the via 102 is removed by chemical mechanical polishing to expose the semiconductor substrate 100.

Referring to FIG. 1D, a second titanium nitride layer 112 is formed on the copper layer 110 to avoid the oxidation and preserve the characters of the interconnections. The process of fabricating copper interconnects described above provides a copper layer in the via as an interconnect. A titanium layer and a titanium nitride layer are deposited between the copper layer and other dielectric layers as a barrier layer and an adhesion layer to protect the copper layer from oxidation and prevent it form diffusing.

A number of limitation to the above method have been discovered, however, particularly when forming fully-planar copper lines by filling grooves in a dielectric and removing the excess. In this case, the copper must be deposited into a feature without leaving a void, so electroplating or chemical vapor deposition is required. It is difficult to deposit refractory copper or metal-copper alloys, such as copper-titanium, with electroplating or chemical vapor deposition techniques.

SUMMARY OF THE INVENTION

It is therefore the object of the invention to provide an improved and simplified method of fabricating copper interconnects. The present invention skips the step of depositing a barrier layer. An impurity doped in the copper layer diffuses toward the surface of the copper layer and reacts with the titanium or a gas to form the barrier layer. The method reduces the cost and the steps to form the barrier layer.

The invention achieves the above-identified objects by providing one new method of fabricating copper interconnection. First, a semiconductor substrate with a trench or a via is provided. A titanium layer is form as a barrier layer on the semiconductor substrate. A copper layer doped with light silicon is formed in the trench or the via. The excess of the copper layer is removed by CMP to expose the surface of the semiconductor substrate. The copper layer is annealed under nitrogen gas to make silicon doped in the copper layer diffuse toward the surface of the copper layer. Silicon reacts with the titanium layer and nitrogen gas to form a silicon nitride layer and a titanium silicide layer to encapsulate the copper layer.

The invention achieves the above-identified objects by providing another new method of fabricating copper interconnection. First, a semiconductor substrate with a trench or a via is provided. A titanium layer is formed as a barrier layer on the semiconductor substrate. A copper layer doped with light silicon is formed in the trench or the via. The excess of the copper layer is removed by CMP to expose the surface of the semiconductor substrate. Then, a second titanium layer is formed on the copper layer. The copper layer is annealed under argon gas to make the silicon doped in the copper layer diffuse toward the surface of the copper layer. Silicon reacts with the titanium layer, the second titanium layer forms a titanium silicide layer to encapsulate the copper layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

First Embodiment

The present invention uses copper as the material for the interconnect lines of a ULSI circuit. Copper was chosen over aluminum for its low bulk electrical resistivity (50% lower than aluminum), and its higher melting temperature (1083° C. versus 600° C.). Copper also exhibits a high electromigration resistance, which greatly improves the reliability of the interconnect lines in functioning properly in the circuit.

If copper is to be used successfully in the ULSI circuit, conformal layers, also referred to as diffusion barriers, are required to prevent the copper from interacting with surrounding materials. The present invention reflects the discovery that copper can be encapsulated with a titanium silicide layer. The titanium silicide layer is used to encapsulate the copper interconnect lines. The interconnect lines of the ULSI circuit exhibit improved thermal stability, higher oxidation resistance, low electrical resistance, and a favorable electromigration lifetime.

Figure 1A:
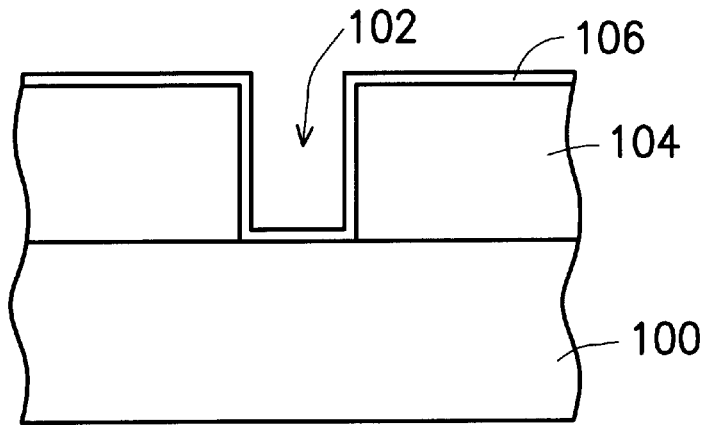
FIGS. 1A–1D are cross-sectional views showing a conventional method of fabricating copper interconnects.
Figure 1B:
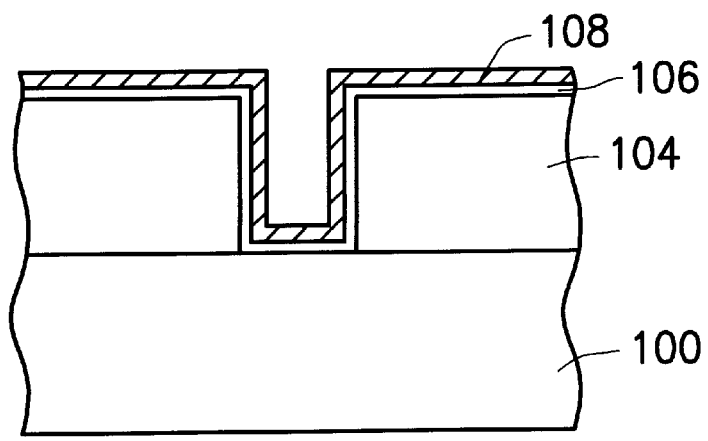
Figure 1C:
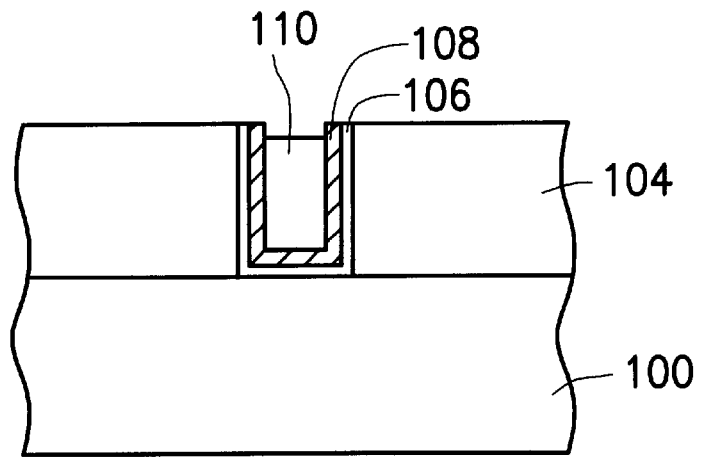
Figure 1D:
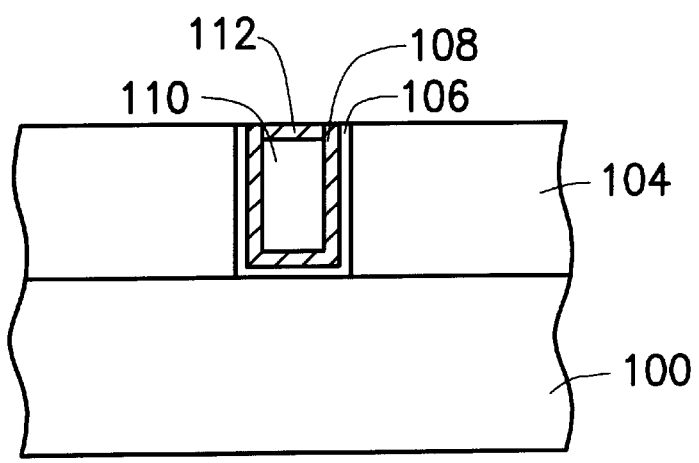
Figure 2A:
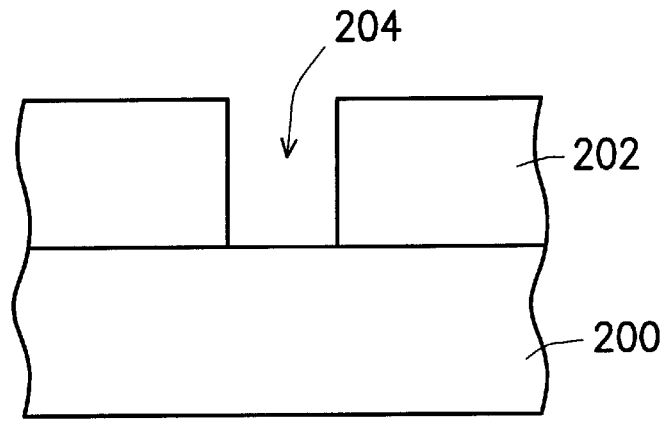
FIGS. 2A–2C are cross-sectional views showing the process steps of a first embodiment of the method of fabricating copper interconnects.

Referring first to FIG. 2A, a semiconductor substrate 200 is provided. A dielectric layer 202 is formed on the semiconductor substrate 200. The material of the dielectric layer is, for example, silicon dioxide formed by chemical vapor deposition (CVD). A trench or a via 204 coupling with the semiconductor substrate 200 is formed in the dielectric layer 202 by photolithography.

Figure 2B:
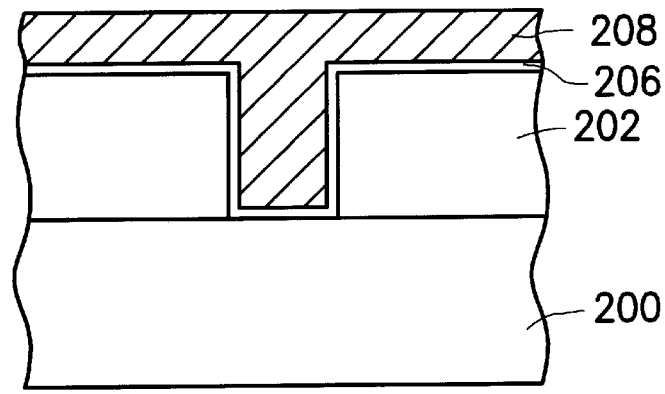

Referring to FIG. 2B, a adhesion layer 206 is formed in the via 204 and on the semiconductor substrate 200. The material of the adhesion layer 206 is, for example, titanium formed by sputtering with a thickness about of 200–500 Å. A copper layer 208 is formed on the adhesion layer 206 and in the via 204. The copper layer has a impurity of silicon. The concentration of the silicon is about 10 percentage.

Figure 2C:
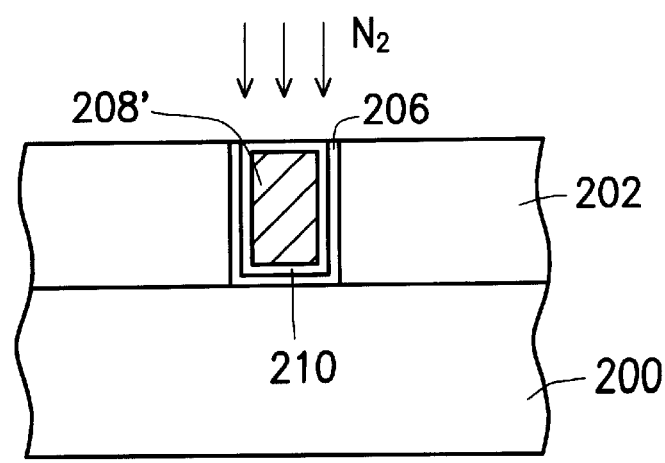

Referring to FIG. 2C, the excess of the copper layer 208 out side of the via 204 is removed, for example, by chemical mechanical polishing (CMP) to expose the semiconductor substrate 200 and form a copper line 208' in the via 204. The step of annealing is proceeded under nitrogen gas. The step makes the silicon doped in the copper layer diffuse toward the surface of the copper layer and react with the adhesion layer 206 and nitrogen gas to form a silicon nitride layer and a titanium silicide layer 210. The silicon nitride layer and the titanium silicide layer 210 encapsulate the copper line 208' to prevent the copper line from oxidation and diffusion.

Figure 3A:
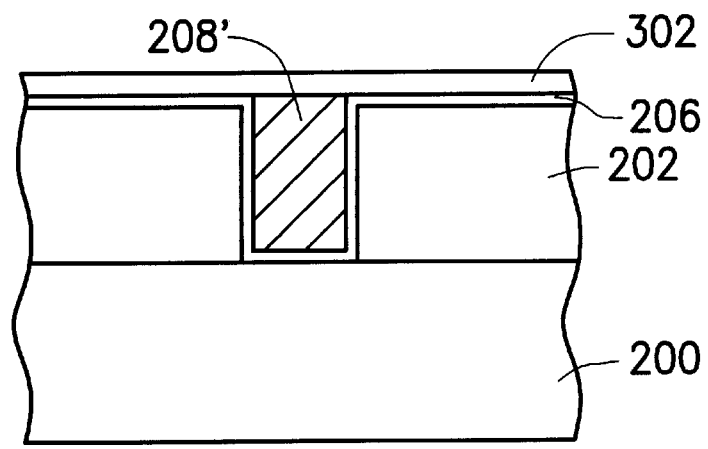
FIGS. 3A–3B are cross-sectional views shoeing the process steps of a second embodiment of the method of fabricating copper interconnects.

Second Embodiment:

Referring first to FIG. 3A, after finishing the structure shown in the FIG. 2B in the first embodiment, the excess of the copper layer 208 is removed, for example, by CMP to expose part of the adhesion layer 206 and form a copper line 208' in the via 204. Then, a second adhesion layer 302 is formed on the copper line 208' and the adhesion layer 206.

Figure 3B:
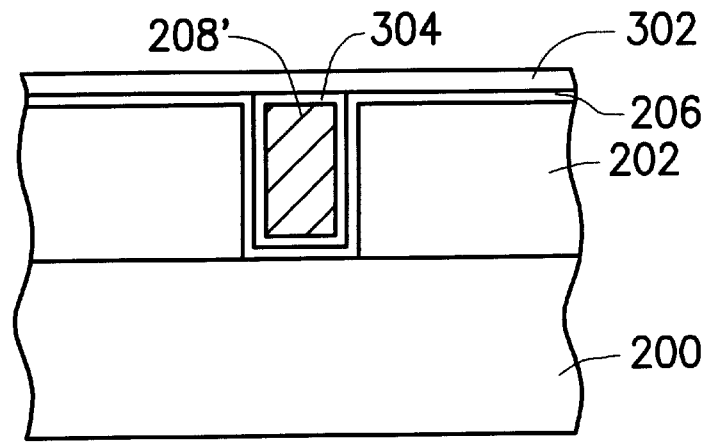

Referring to FIG. 3B, a step of annealing is done under argon gas. The step makes the silicon doped in the copper lines 208' diffuse toward the surface of the copper line 208', and react with the adhesion layer 206 and the second adhesion layer to form a titanium silicide layer 304. The titanium silicide layer 304 encapsulates the copper line to prevent from oxidation and diffusion.

The present invention provides a method using the silicon doped in the copper layer to form a titanium silicide layer by reacting the silicon with titanium in the step of annealing. The titanium silicide layer prevents the copper line from oxidation and diffusion. The present invention is a simple process and reduces the cost.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating copper interconnection, comprising the steps of:

providing a semiconductor substrate, wherein the semiconductor substrate at least has a trench or a via;

forming an adhesion layer in the trench or the via and on the semiconductor substrate;

forming a copper layer on the adhesion layer, wherein the copper layer has an impurity of silicon, wherein the impurity of silicon is doped in the copper layer; and annealing under nitrogen to form a silicide layer encapsulating the copper layer and a silicon nitride layer.

2. A method according to claim 1, wherein the adhesion layer is a metal layer.

3. A method according to claim 2, wherein a material of the metal layer is titanium or tantalum.

4. A method according to claim 1, wherein the copper layer having an impurity of silicon and the adhesion layer are partially removed to expose the surface of the semiconductor substrate before the step of annealing under nitrogen gas.

5. A method according to claim 4, wherein the step of partially removing the copper layer having a impurity with silicon is done by chemical mechanical polishing.

6. A method according to claim 4, wherein the silicon doped in the copper layer is about 10 percentage.

7. A method of fabricating copper interconnection, comprising the step of:

providing a semiconductor substrate, wherein the semiconductor substrate at least has a trench or a via;

forming a first adhesion layer in the trench or the via;

forming a copper layer with a impurity of silicon on the first adhesion layer;

partially removing the copper layer with a impurity of silicon and the first adhesion layer to expose the semiconductor substrate, wherein the impurity of silicon is doped in the copper layer;

forming a second adhesion layer on the copper layer with an impurity of silicon and the semiconductor substrate; and annealing under argon gas to form a silicide layer encapsulating the copper layer.

8. A method according to claim 7, wherein the first adhesion layer is a metal layer.

9. A method according to claim 8, wherein the material of the metal layer is titanium or tantalum.

10. A method according to claim 7, wherein the silicon doped in the copper layer is about 10 percentage.

11. A method according to claim 7, wherein the second adhesion layer is a metal layer.

12. A method according to claim 11, wherein the material of the metal layer is titanium or tantalum.

13. A method according to claim 7, wherein the step of partially removing the copper layer with a impurity of silicon and the first adhesion layer to expose the semiconductor substrate is done by chemical mechanical polishing.

14. A method of fabricating copper interconnection, comprising the steps of:

proving a semiconductor substrate;

forming a trench or a via on the semiconductor substrate;

forming a titanium layer in the trench or the via and on the semiconductor substrate;

forming a copper layer with a impurity of silicon on the titanium layer, wherein the impurity of silicon is doped in the copper layer;

partially removing the copper layer with an impurity of silicon to expose the semiconductor substrate; and annealing under nitrogen gas to form a titanium silicide layer encapsulating the copper layer and a silicon nitride layer.

15. A method according to claim 14, wherein the silicon doped in the copper layer is about 10 percentage.

* * * * *